United States Patent [19]

Brody

[11] 4,144,591
[45] Mar. 13, 1979

[54] MEMORY TRANSISTOR

[75] Inventor: Philip S. Brody, Brookmont, Md.

[73] Assignee: The United States of America as represented by the Secretary of the Army, Washington, D.C.

[21] Appl. No.: 893,567

[22] Filed: Apr. 5, 1978

Related U.S. Application Data

[63] Continuation-in-part of Ser. No. 824,894, Aug. 15, 1977, Pat. No. 4,051,465, which is a continuation-in-part of Ser. No. 533,305, Dec. 24, 1974, Pat. No. 3,855,004.

[51] Int. Cl.² .................. G11C 11/22; G11C 11/42
[52] U.S. Cl. .................................. 365/228; 365/117; 365/145; 365/154
[58] Field of Search ............... 365/103, 106, 114, 154, 365/145, 226, 228, 229

[56] References Cited

U.S. PATENT DOCUMENTS

| | | | |
|---|---|---|---|
| 3,518,634 | 6/1970 | Ballman | 365/114 |
| 3,812,479 | 5/1974 | Witteles | 365/114 |
| 4,011,442 | 3/1977 | Engeler | 365/114 |

Primary Examiner—Terrell W. Fears
Attorney, Agent, or Firm—Nathan Edelberg; Robert P. Gibson; Saul Elbaum

[57] ABSTRACT

A memory transistor in which a photovoltaic-ferroelectric element is connected between the gate and source of a field effect transistor. The element stores a remanent polarization in a direction corresponding to the polarity of a voltage to be applied to the transistor, and when the element is illuminated the voltage is generated and is applied. A restorable cross-coupled flip-flop in which memory information is stored in a pair of photovoltaic-ferroelectric elements. If power is lost, the elements are illuminated and the information which was lost from the memory is restored.

8 Claims, 5 Drawing Figures

MEMORY TRANSISTOR

RIGHTS OF THE GOVERNMENT

The invention described herein may be manufactured, used, and licensed by or for the United States Government for governmental purposes without the payment to us of any royalty thereon.

The present application is a continuation-in-part of U.S. Patent Application Ser. No. 824,894 filed Aug. 15, 1977, incorporated herein by reference, which in turn is a continuation-in-part of U.S. Patent Application Ser. No. 533,305 filed Dec. 24, 1974, now U.S. Pat. No. 4,051,465, and U.S. Pat. No. 3,855,004, both of which are incorporated herein by reference.

The present invention is directed to an improved memory transistor and to an application therefor.

A memory transistor is one which stores information regarding a selected on or off state, which state is retained even after loss of external power.

While in such a device it is desirable for the stored information to be retained over an indefinite period of time, in prior art devices the stored information has decayed, and this has particularly been a problem at elevated temperatures. Additionally, such devices are responsive to an external stimulus such as visible light, X-ray radiation, or UV radiation so that above some level, these factors can cause false changes in state. Memory transistors of the prior art, for example the floating gate charge type are subject to this limitation. Finally, it is desirable for the memory transistor to be indefinitely recyclable, unlike some prior art devices.

It is therefore an object of the invention to provide an improved memory transistor.

It is a further object of the invention to provide a memory transistor which has the capability of storing information for an indefinite period of time.

It is a further object of the invention to provide a memory transistor which is not subject to false changes in state.

It is a further object of the invention to provide a memory transistor which is idenfinitely recyclable.

It is a further object of the invention to provide a memory transistor in which the effect of the stored information is to generate relatively large gate bias voltages.

It is a further object of the invention to provide an improved programmable read only memory.

It is still a further object of the device to provide an improved restorable memory.

The above objects are accomplished by providing a memory transistor which is comprised of a transistor in circuit connection with a photovoltaic-ferroelectric material element. The state information is stored in the photovoltaic-ferroelectric material element by remanently polarizing it in either of one of two directions. The remanent polarization information is stored in the element indefinitely, and upon illumination, it generates either a position or negative voltage, depending on the direction of polarization, which voltage is applied to the transistor gate as a bias voltage.

The invention will be better understood by referring to the accompanying drawings in which.

Figure 1:
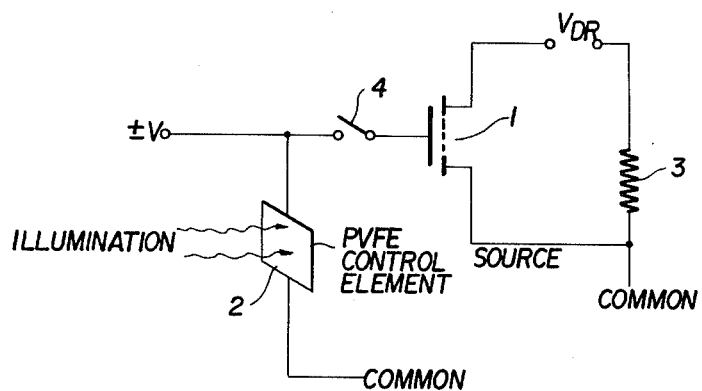
FIG. 1 is a schematic diagram of an embodiment of the invention.

FIG. 1 is a schematic diagram of an embodiment of the invention utilizing a channel enhancement type MOSFET transistor. It should be understood that while the invention is illustrated in conjunction with the use of MOSFET type devices, it has general applicability to solid state switching devices, and can be used in any situation where it is necessary to store biasing signal information and then to apply the bias signal to a switching device to trigger the device into one of two possible states.

Referring to FIG. 1, a P channel enhancement type MOSFET transistor is provided. A voltage source $V_{DR}$ and a load resistor 3 are connected between the drain and source of the transistor. Additionally, a photovoltaic-ferroelectric material control element 2 is connected between the gate and the source, through a switch 4 if desired.

Photovoltaic-ferroelectric materials are certain ferroelectric materials, which after having been remanently polarized by the application of a poling voltage, produce a photovoltage upon being illuminated. The direction of the photovoltage is dependent upon the direction of the poling voltage, and the properties of such materials, as well as representative examples of the actual materials, are discussed in above-mentioned U.S. Pat. No. 3,855,004, and U.S. Pat. No. 4,057,465 which are incorporated herein by reference.

Referring to FIG. 1, to store state information in the device, a poling voltage in the form of either a positive voltage pulse or a negative voltage pulse ($\pm V$ in the FIG. 1) is applied. Due to the characteristics of the photovoltaic-ferroelectric material, if the poling voltage pulse is negative on the gate side, then subsequent illumination of the control element results in a negative gate-source bias which produces source-drain conductivity, thereby turning the memory transistor on. On the other hand, if the poling voltage is positive on the gate side, subsequent illumination results in a positive gate-source bias which does not produce any conductivity, the memory transistor then being in the off state.

In the above arrangement, as well as appearing at the control element, the poling voltage appears at the gate and other common points. It thus must be limited in magnitude so that the value of the poling voltage relative to the drain or the source or body elements is less than the respective breakdown voltages relative to these elements. While proper design will insure such a solution, such design also sets restrictions on the parameters required for the control element and for the transistor. The restrictions on breakdown voltages and poling voltages can be minimized by introducing a switch means 4, which separates or floats the gate during the time when the poling voltage is applied. While shown as a mechanical switch, in FIG. 1, it is understood that in an actual embodiment, switch means 4 could be a solid state switch means.

In one application of the invention, a plurality of memory transistors are assembled in an array to form a programmable read only memory. Since control element 2 produces a biasing voltage only while actually being illuminated, a source of constant illumination is required for the transistor to be in the programmed state. While the bias voltages ordinarily produced by the photovoltaic-ferroelectric material elements are usually large enough to produce saturation drain-source currents, the voltage generated is reduced at low levels of intensity. The illumination is thus set at a sufficiently high value. Such illumination could be provided by a conventional flourescent lamp source preferably with a phosphor-producing maximum output in the near ultraviolet.

Figure 2:
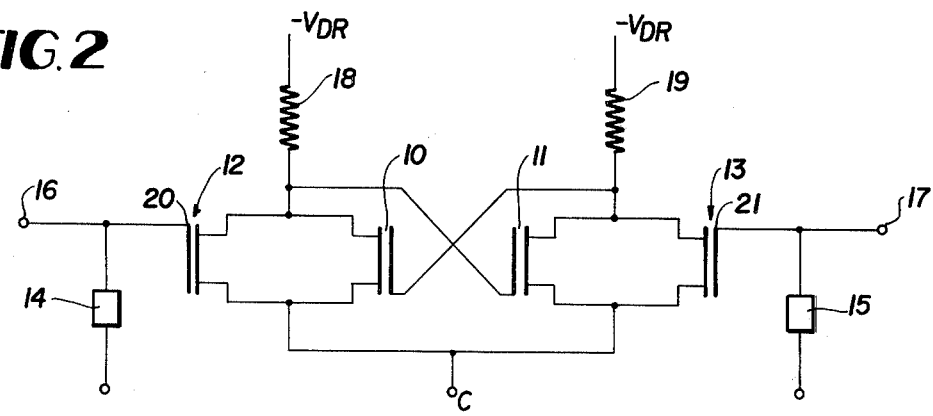
FIG. 2 is a schematic diagram of a further embodiment of the invention.

FIG. 2 shows a second embodiment of the invention in which the memory transistors are used in a restorable memory. In general, one disadvantage of solid state serial or random access memories is that they are volatile; that is, when operating power is lost, all of the stored information is also lost. A restorable memory functions in the manner of a volatile memory, but is structured so that information which is lost may be restored by the application of an external stimuli. In this case the external stimuli is properly specified illumination.

Again, while the embodiment of FIG. 2 is illustrated in conjunction with MOSFET devices, it should be understood that it has more general applicability as described above. In general, the embodiment of FIG. 2 works by modifying a memory array comprised of a plurality of memory cells by also storing the information stored in the memory cells in photovoltaic-ferroelectric elements in the form of remanent polarization. When power is lost the remanent polarization is retained, and upon illumination, the photovoltaic-ferreoelectric elements generate appropriate biasing voltages for re-setting the memory cells to their original state.

FIG. 2 is a schematic diagram of a restorable cross-coupled flip-flop. The circuit is comprised of cross-coupled MOSFET transistors 10 and 11 which are connected respectively to memory transistors 12, 14 and 13, 15. The flip-flop is set into bi-stable state A, which is defined as the state with significant current flowing in resistor 18 but essentially no current flow in resistor 19, by the application of a pulse which is negative with respect to ground, to gate electrode 16, while simultaneously applying a pulse which is positive with respect to ground to gate electrode 17.

Figure 3:
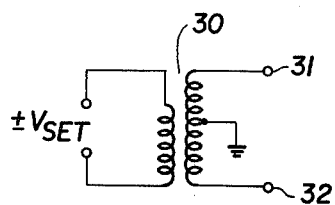
FIG. 3 shows one arrangement for providing polarization switching signals to the circuit of FIG. 2.

These types of signals can be generated, for example, by the transformer arrangement shown in FIG. 3. In this arrangement, with a voltage applied to the primary of transformer 30, voltage outputs of opposite polarity will appear between output contact 31 and ground and output contact 32 and ground.

The pulses which set the bi-stable unit also introduce a remanent polarization, $P_s$, in the photovoltaic-ferroelectric elements 14 and 15. Since the pulses are of opposite polarity, oppositely directed remanent polarizations are created in the two photovoltaic-ferroelectric elements. In the example given, element 14 is polarized so that the positive bound polarization charge is adjacent to the topmost electrode in the FIG. which is connected directly to gate electrode 20. On the other hand, element 15 is polarized so that the negative bound polarization charge is adjacent to the topmost electrode, which is connected directly to gate electrode 21.

The flip-flop is set into bi-stable state B which is defined as the state where essentially no current flows through resistor 18 but significant current flows through resistor 19, by applying pulses of polarity opposite to that given in the above example, to contacts 16 and 17. These pulses introduce remanent polarizations into the elements 14 and 15 which are oppositely directed to the polarizations introduced by the first pulses described in the above example.

If power fails when the flip-flop is in bi-stable state A, then the polarization in elements 14 and 15 is directed so that when these elements are illuminated, the photovoltage generated is of such polarity, and of sufficient magnitude, to set the bi-stable device into the same state A which it was in when the power failed. If the bi-stable device was in state B when power was lost, then the illumination of the photovoltaic-ferroelectric elements restores the device to state B. In the arrangement shown in FIG. 2, it is desirable that the voltages for introducing the remanent polarization into the photovoltaic-ferroelectric elements should not exceed the relevant FET breakdown voltages such as the gate-source breakdown voltage and the gate body breakdown voltage.

The MOSFET input characteristics and the photovoltaic-ferroelectric output characteristics compliment each other because the MOSFET devices have high input resistance and low input capacity with switching thresholds at moderate voltages (order of 1–10 volts) while the photovoltaic-ferroelectric elements have high output resistance and produce moderate output voltages. Photovoltaic-ferroelectric control for an element with dimensions approximately equal to the width of a FETMOS structure is of the order of 1 to 10 volts. The use of such a combination to provide a non-volatile memory function is therefore particularly attractive in terns of applicability to an integrated design and also to large scale integration. Also of particular importance is that fact that the saturation output voltage of the photovoltaic-ferroelectric elements can be controlled by controlling the grain size thereof and can be increased to suitably large values if desired as described in the above-mentioned patent and patent application.

The embodiments described above are illustrated in circuit form. As actual devices, they can be in the form of fabricated discrete devices or incorporated into small scale or large scale integrated circuit designs. A factor which makes this type of device suitable for LSI design is the current state of the art in deposition techniques which allows masked deposition of ferroelectric ceramics by ion beam bombardment techniques (sputtering), or electron beam techniques, or by the technique of electrophoretic deposition.

Two general physical configurations integrating the photovoltaic-ferroelectric control element into a MOSFET structure are possible. Each has its advantages from the point of view of either fabrication or functional characteristics. In one, the photovoltaic output is produced by absorption of activating photons within the surface of the photovoltaic-ferroelectric element, and the output is from electrodes which are placed so as not to obscure the absorbing surface. In the other, the photons essentially uniformly illuminate the interior of the photovoltaic-ferroelectric material, and one connection must be made to the gate through a transparent electrode or partially obscuring electrode.

Figure 4:
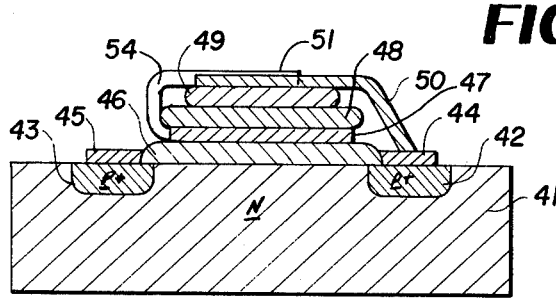
FIG. 4 is a cross-sectional view of one form of an integrated circuit structure embodying the circuit of FIG. 1.
Figure 5:
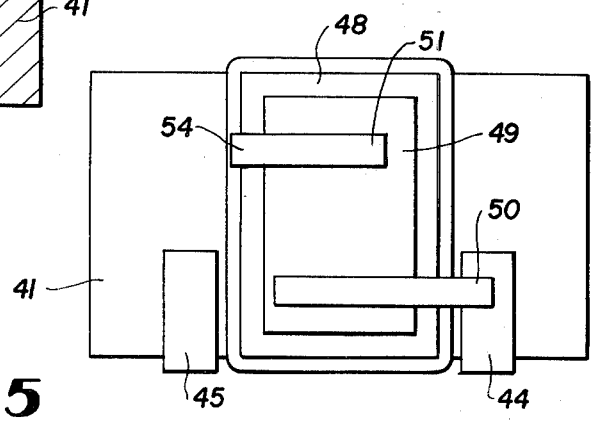
FIG. 5 is a top view of the structure of FIG. 4.

Because of the dimensional considerations the first-described type produces higher bias voltages which are suitable for saturation current functioning, and FIGS. 4 and 5 are cross-sectional and top views respectively of such a structure. The transistor is NMOS FET with the photovoltaic-ferroelectric control element disposed on top of the gate electrode but separated from it by an insulating dielectric. Referring to 4 it is seen that field effect transistor 40 is comprised of N type silicon substrate 41 having pockets of P type material 42 and 43 disposed therein. Drain contact 45 overlies pocket 43 while source contact 44 overlies pocket 42. The region between and above the pockets is covered by insulating oxidized silicon 46 and gate electrode 47.

Disposed above gate electrode 47 is an insulating dielectric layer 48 made either of $Al_2O_3$ or oxidized polysilicon or other suitable insulating material. The photovoltaic-ferroelectric control element 49 overlies the insulating layer and is a rectangle of material disposed with the long side of the rectangle lying along the width, that is the longer direction, of the transistor. Electrodes 51 and 50 have been affixed to the control element and these are connected respectively to the gate 47 and the source contact 44. This control element may for example be made of PZT-5A material which may be deposited by a sputtering type process. The thickness of the element may be of the order of 0.0005" which is sufficient to absorb all incoming radiation for band gap vicinity light.

In an actual embodiment built, the polarizing or store voltage, which can also be the switch-on voltage is ±80 volts. The output current, that is the gate-source initial input current, for an illumination intensity of 1 watt/cm$^2$ UV light centered about 380 nm is about $10^{-11}$ amperes with a saturation open circuit voltage of 6 volts. This can be compared to a typical gate-source leakage current for the same voltage of $10^{-12}$A. A typical value of gate-common input capacity would be 2 pfd which means that the time required for illumination generated turn-on or off is about 1 second. More current can be produced by increasing the illumination intensity and such higher intensities may be necessary in some applications.

I wish it to be understood that I do not desire to be limited to the exact details of construction shown and described, for obvious modifications can be made by a person skilled in the art.

I claim:

1. A memory transistor comprising,
    a solid state switch means capable of assuming one of two states dependent on the polarity of a bias signal which is to be applied thereto,
    a photovoltaic-ferroelectric means for storing information regarding the polarity of said bias signal, which information is stored in the form of a remanent polarization in one of two possible directions,
    illumination means for illuminating said photovoltaic-ferroelectric means when it is desired to generate said bias signal, and
    means for applying said generated bias signal to said solid state switch means.

2. The memory transistor of claim 1 wherein said switch means is a MOSFET transistor means and wherein said photovoltaic-ferroelectric means is connected between the gate and source of the transistor means.

3. The memory transistor of claim 2 wherein a voltage source and load resistor are connected between the drain and source of the transistor means.

4. The memory transistor of claim 2 further including a switch means for isolating said transistor means from a voltage which is applied to said photovoltaic-ferroelectric means to create said remanent polarization.

5. A restorable memory comprising,
    a flip-flop comprised of at least two switching elements,
    means for applying biasing voltages of opposite polarities to said switching elements to switch said flip-flop into one of its states or the other,
    a pair of photovoltaic-ferroelectric elements, each element being connected to a said switching element so that the biasing voltage applied to said switching element creates a remanent polarization in said photovoltaic-ferroelectric element in a direction which will produce a voltage of the same polarity as said biasing voltage when said photovoltaic-ferroelectric element is illuminated, and
    means for illuminating said photovoltaic-ferroelectric element when power to said flip-flop is lost whereby biasing voltages are applied by said photovoltaic-ferroelectric elements to said solid state elements to return the flip-flop to the state which it was in when said power was lost.

6. The restorable memory of claim 5 wherein said flip-flop is a cross-coupled MOSFET flip-flop.

7. The memory transistor of claim 2 wherein said MOSFET transistor means and said photovoltaic-ferroelectric means are part of an integrated structure, said photovoltaic-ferroelectric means overlying the gate of said MOSFET transistor means but being separated from it by an insulating dielectric layer.

8. The memory transistor of claim 7 wherein the gate electrode of said MOSFET transistor means and one electrode of said photovoltaic-ferroelectric means are common.

* * * * *